(12) United States Patent
Heo

(10) Patent No.: US 12,293,481 B2
(45) Date of Patent: May 6, 2025

(54) METHOD AND SYSTEM FOR SUPPORTING MOLD DESIGN OF VEHICLE BODY PANEL

(71) Applicants: Hyundai Motor Company, Seoul (KR); Kia Corporation, Seoul (KR)

(72) Inventor: Wonkang Heo, Busan (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 251 days.

(21) Appl. No.: 17/983,761

(22) Filed: Nov. 9, 2022

(65) Prior Publication Data
US 2023/0145302 A1 May 11, 2023

(30) Foreign Application Priority Data
Nov. 10, 2021 (KR) ................. 10-2021-0154227

(51) Int. Cl.
*G06T 19/20* (2011.01)
*G06F 30/15* (2020.01)
*G06T 7/50* (2017.01)

(52) U.S. Cl.
CPC .............. *G06T 19/20* (2013.01); *G06F 30/15* (2020.01); *G06T 7/50* (2017.01); *G06T 2200/04* (2013.01); *G06T 2207/20081* (2013.01); *G06T 2207/20084* (2013.01); *G06T 2207/20224* (2013.01); *G06T 2219/2004* (2013.01); *G06T 2219/2021* (2013.01)

(58) Field of Classification Search
CPC ....... G06T 19/20; G06T 7/50; G06T 2200/04; G06T 2207/20081; G06T 2207/20084; G06T 2207/20224; G06T 2219/2004; G06T 2219/2021; G06T 17/10; G06F 30/15; G06F 30/27; G06F 30/17; G06F 16/532; G06F 2111/06; G06N 3/0464; G06N 3/08; H04N 13/271
See application file for complete search history.

(56) References Cited

PUBLICATIONS

Dung, V. T. (2018). Automatic reconstruction of nominal freeform surfaces in aero-components for remanufacturing. Doctoral thesis, Nanyang Technological University, Singapore. (Year: 2018).*
Han, Xiaoguang, et al. "High-resolution shape completion using deep neural networks for global structure and local geometry inference." Proceedings of the IEEE international conference on computer vision. 2017. (Year: 2017).*

* cited by examiner

*Primary Examiner* — Yu Chen
(74) *Attorney, Agent, or Firm* — Fox Rothschild LLP

(57) ABSTRACT

The present disclosure relates to a method for supporting a mold design of a vehicle body panel and a system for performing the same. A method for supporting a mold design according to an exemplary embodiment may include: generating a target depth map (a depth map), which is a 2D image, from target design data of a target vehicle body panel, which is a 3D image; inputting the target depth map to a prediction model of an artificial neural network structure to obtain a correction value data for mold design for designing mold data from the target design data; and visualizing and displaying a correction value data for the mold design.

17 Claims, 8 Drawing Sheets

METHOD AND SYSTEM FOR SUPPORTING MOLD DESIGN OF VEHICLE BODY PANEL

CROSS-REFERENCE TO RELATED APPLICATION

This application is based on and claims the benefit of Korean Patent Application No. 10-2021-0154227 filed in the Korean Intellectual Property Office on Nov. 10, 2021, the entire contents of which are incorporated herein by reference.

TECHNICAL FIELD

The present disclosure relates to a method for supporting a mold design of a vehicle body panel and a system for performing the same.

BACKGROUND

For manufacturing a vehicle body panel, correction work is required to design a mass-production mold after a panel design is confirmed. When using a panel drawing which is a 3D (a three-dimensional) image as it is for the correction work, there is a problem that detailed tuning is difficult due to a large amount of computation.

The study of applying deep learning models to 3D images has mainly been conducted for academic purposes, and it is insufficient to be applied to actual industrial sites. Therefore, when the deep learning model is applied to design the mass-production mold from the 3D drawing of the body panel of the vehicle whose design has been confirmed, there is a problem in that the prediction accuracy of the correction value for the mass-production mold design is lowered.

The above information disclosed in this Background section is only for enhancement of understanding of the background of the disclosure, and therefore it may contain information that does not form the prior art that is already known in this country to a person of ordinary skill in the art.

SUMMARY

The object to be solved through exemplary embodiments is to provide a method for supporting a mold design of a vehicle body panel and a system supporting the same to improve speed and workability of mold design work of a vehicle body panel.

In some embodiments, a method for supporting a mold design of a vehicle body panel according to an exemplary embodiment may include: generating a target depth map, which is a 2D image, from a target design data of a target vehicle body panel, which is a 3D image; inputting the target depth map to a prediction model of an artificial neural network structure to obtain a correction value data for a mold design for designing mold data from the target design data; and visualizing and/or displaying correction value data for the mold design. One or more of the above steps may comprise use of a controller.

In some embodiments, the generating may include generating the target depth map from the target design data by using an orthographic view manner.

In some embodiments, the method for supporting the mold design may further include generating the prediction model by learning an artificial neural network in a deep learning manner.

In some embodiments, the generating of the prediction model may include: respectively converting and generating a learning depth map as a 2D image from learning design data and learning mold data as a 3D image for each of a plurality of vehicle types; generating a difference map between the learning depth map of the learning design data and the learning depth map of the learning mold data for each of the plurality of vehicle types; dividing the learning depth map and the difference map corresponding to each of the learning design data and the learning mold data into a plurality of learning patches, respectively; normalizing the plurality of learning patches; generating a plurality of learning data from a plurality of normalized learning patches through data augmentation; and learning the artificial neural network to generate the prediction model by using the plurality of learning data.

In some embodiments, the method for supporting the mold design may further include correcting values of pixels positioned in the edge region of the vehicle body panel in the difference map through interpolation.

In some embodiments, the dividing into the plurality of learning patches may include dividing the difference map corrected by interpolation into the plurality of learning patches.

In some embodiments, the artificial neural network may be a structure in which a classifier of an output layer is removed from a UNET-based artificial neural network. For a loss function of the artificial neural network, a weight value may be applied according to a gradient per pixel of the learning depth map of the learning design data, and the weight value may decrease when the gradient of the corresponding pixel is greater than or equal to a predetermined value.

In some embodiments, the method for supporting the mold design may further include dividing the target depth map into a plurality of target patches, In some embodiments, the obtaining of the correction value data for the mold design may include: inputting the plurality of target patches to the prediction model to obtain a plurality of correction value data corresponding to the plurality of target patches from the prediction model; and integrating the plurality of correction value data to obtain a correction value data for the mold design.

In some embodiments, the method for supporting the mold design may further include: displaying a list of at least one vehicle type that may be used as reference data during the mold design through an image similarity search; and visualizing and displaying actual correction value data between the design data and the mold data of the vehicle body panel of a vehicle type selected from the list if any one vehicle type is selected from the list.

In some embodiments, the method for supporting the mold design may further include overlapping and displaying the design data of the vehicle body panel of the vehicle type selected from the list and the target design data based on the depth map.

In some embodiments, a system for supporting a mold design of a vehicle body panel according to an exemplary embodiment includes: a learning system generating a prediction model that predicts a correction value data for a mold design for designing mold data from a target design data of a target vehicle body panel by learning an artificial neural network in a deep learning method; a prediction system generating a target depth map that is a 2D image from the target design data that is a 3D image, and obtaining correction value data for the mold design by inputting the target depth map to the prediction model; and a design supporting system visualizing and displaying correction value data for the mold design.

In some embodiments, the prediction system may generate the target depth map from the target design data by using an orthogonal view method.

In some embodiments, the learning system may include: a depth map generating unit respectively generating a learning depth map as a 2D image from the learning design data and the learning mold data as a 3D image for each of a plurality of vehicle types; a difference map generating unit for generating, for each of the plurality of vehicle types, a difference map between the learning depth map of the learning design data and the learning depth map of the learning mold data; a learning data generating unit respectively dividing the learning depth map and the difference map corresponding to the learning design data and the learning mold data into a plurality of learning patches, normalizing the plurality of learning patches, and generating a plurality of learning data from the plurality of learning patches through data augmentation; and a learning unit generating the prediction model by using the plurality of learning data to learn the artificial neural network system.

In some embodiments, the learning system may further include a data correcting unit that corrects the values of the pixels positioned in the edge region of the vehicle body panel in the difference map through interpolation, and the learning data generating unit may divide the difference map corrected by interpolation into the plurality of learning patches.

In some embodiments, the artificial neural network may be a structure in which a classifier of an output layer has been removed from a UNET-based artificial neural network. For the loss function of the artificial neural network, a weight value may be applied according to the gradient per pixel of the learning depth map of the learning design data, and the weight value may decrease when the gradient of the corresponding pixel is greater than or equal to a predetermined value.

In some embodiments, the prediction system may include: a data division unit that divides the target depth map into a plurality of target patches; a prediction unit that inputs the plurality of target patches to the prediction model to obtain a plurality of correction value data from the prediction model; and a data synthesis unit for merging the plurality of correction value data to obtain correction value data for the mold design.

In some embodiments, the design supporting system may display a list of at least one vehicle type that may be used as a reference data during a mold design through an image similarity search, and visualize and display the actual correction value data between the design data and the mold data of the vehicle body panel of a vehicle type selected from the list if any one vehicle type is selected from the list.

In some embodiments, the design supporting system may overlap and display the design data of the vehicle body panel of the vehicle type selected from the list and the target design data based on the depth map.

According to the exemplary embodiment, after the vehicle body panel design is confirmed, a mass-production mold design speed and workability may be improved by predicting the correction value for designing the mass-production mold.

Therefore, even if the work skill of the design worker is low, it is possible to design the mass-production mold quickly, thereby preventing the vehicle type development schedule from being delayed, and reducing the number of revision processes.

As discussed, the method and system suitably include use of a controller or processer including where one or more or each of the steps of the methods disclosed herein or one or more or each of the elements of the system disclosed herein include a controller or use of a controller.

For instance, methods for a mold design for a vehicle body panel are provided comprising: a) generating via controller a target depth map (a depth map), which is a 2D image, from target design data of a target vehicle body panel, which is a 3D image; b) inputting via a controller the target depth map to a prediction model of an artificial neural network structure to obtain a correction value data for a mold design for designing mold data from the target design data; and c) visualizing and/or displaying via a controller correction value data for the mold design.

DETAILED DESCRIPTION OF THE EMBODIMENTS

Figure 1:
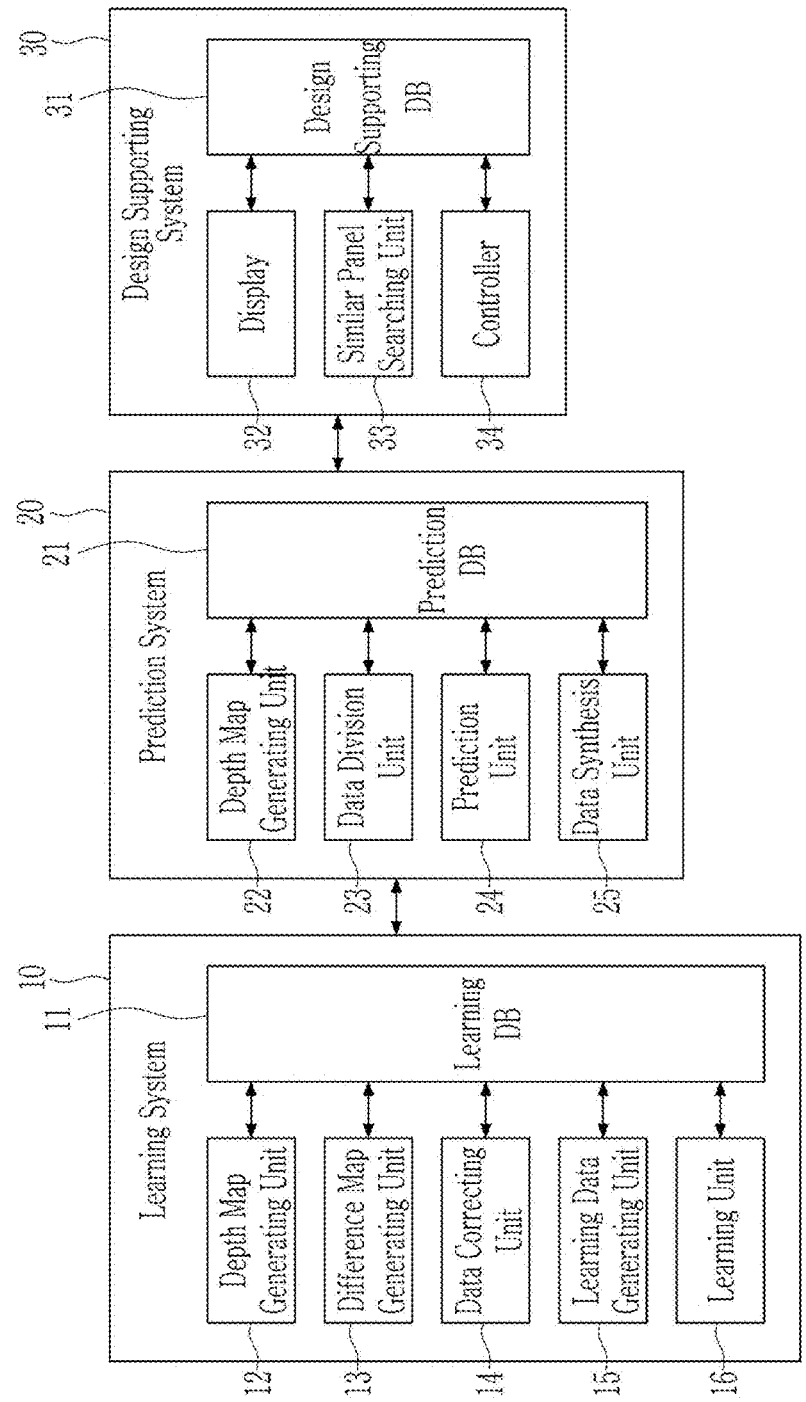
FIG. 1 is a view schematically showing a system for supporting a design of a vehicle body panel according to an exemplary embodiment.

Hereinafter, embodiments disclosed in the present specification will be described in detail with reference to the accompanying drawings. In the present specification, the same or similar components will be denoted by the same or similar reference numerals, and an overlapped description thereof will be omitted.

The terms "module" and "unit" for components used in the following description are used only in order to easily make a specification. Therefore, these terms do not have meanings or roles that distinguish them from each other in themselves. Further, in describing embodiments of the present specification, when it is determined that a detailed description of the well-known art associated with the present disclosure may obscure the gist of the present disclosure, it will be omitted. In addition, the accompanying drawings are provided only in order to allow embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Terms including ordinal numbers such as first, second, and the like will be used only to describe various components, and are not to be interpreted as limiting these components. The terms are only used to differentiate one component from other components.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected to or coupled to another component without another component intervening therebetween.

It will be further understood that terms "comprise" and "have" used in the present specification specify the presence of stated features, numerals, steps, operations, components, parts, or a combination thereof, but do not preclude the presence or addition of one or more other features, numerals, steps, operations, components, parts, or a combination thereof.

In addition, the terms "-er", "-or", and "module" described in the specification mean units for processing at least one function and operation and can be implemented by hardware components or software components and combinations thereof.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. These terms are merely intended to distinguish one component from another component, and the terms do not limit the nature, sequence or order of the constituent components. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, a method for supporting a mold design of a vehicle body panel and a system for performing the same according to an exemplary embodiment are described in detail with reference to necessary drawings.

FIG. 1 is a view schematically showing a system for supporting a design of a vehicle body panel according to an exemplary embodiment.

Referring to FIG. 1, a system for supporting a design of a vehicle body panel 1 may include a learning system 10, a prediction system 20, and a design supporting system 30.

The learning system 10 may be a learning system based on a deep learning and may generate a prediction model to predict a correction value required for mass-production mold design of a vehicle body panel. The learning system 10 may include a learning database (DB) 11, a depth map generating unit 12, a difference map generating unit 13, a data correcting unit 14, a learning data generating unit 15, and a learning unit 16.

The learning DB 11 may store various data processed in the learning system 10. The learning DB 11 may store a design data (hereinafter, referred to as 'learning design data') and mold data (hereinafter, referred to as 'learning mold data') of the vehicle body panels of the vehicle types for which the mass-production mold design has already been completed. In this document, the design data may represent a 3D drawing data obtained in the design step of the vehicle body panel, and the mold data may represent a 3D drawing data of a mass-production mold obtained through the correction of the design data.

The depth map generating unit 12 may generate a depth map (hereinafter, referred to as 'a learning depth map') for each of the learning design data and the learning mold data of each vehicle body panel stored in the learning DB 11. The depth map generating unit 12 may acquire a depth value (i.e., a distance from a rendering plane) for each pixel from each learning design data or learning mold data that is the 3D image by using an orthographic view manner. In addition, the depth map generating unit 12 may generate a 2D (two-dimensional) image having the acquired depth value for each pixel as a pixel value of the corresponding pixel and obtain it as a learning depth map of the corresponding learning design data or learning mold data. The orthogonal view method is one of methods of converting a 3D image into a 2D image and is a method using a virtual ray that travels at a right angle to each pixel of the 3D image to obtain the distance between the pixel and a light source, that is, the distance between the pixel and the rendering plane where the light source is positioned and to generate the depth map, which is a 2D image, by using this.

Figure 2A:
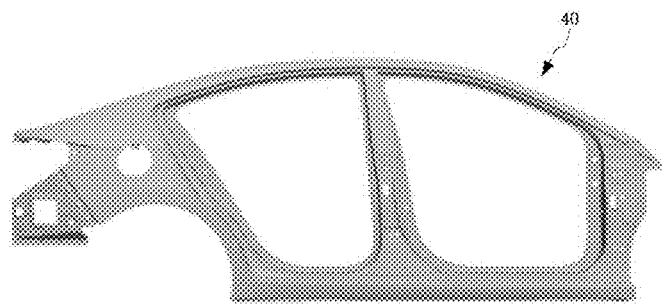
FIG. 2A is a view showing one example of a design data of a vehicle body panel.
Figure 2B:
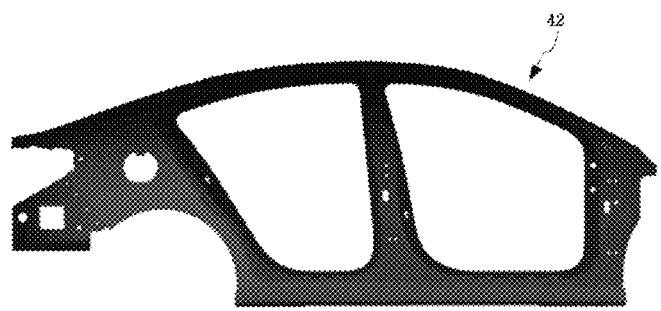
FIG. 2B is a view showing one example of a 2D depth map obtained from a design data of FIG. 2A.

FIG. 2A is a view showing one example of a design data of a vehicle body panel, and FIG. 2B is a view showing one example of a 2D depth map obtained from a design data of FIG. 2A.

As shown in FIG. 2A, the vehicle body panel 40 is seen in a shape having a large width both horizontally and vertically when viewed in the direction viewing the vehicle from the side of the vehicle. However, when the vehicle body panel is viewed in the direction viewing the vehicle from the rear of the vehicle, it may be seen in an approximate straight-line shape. Therefore, even if the 3D image (the design data, the mold data) of the vehicle body panel shown in FIG. 2A, as shown in FIG. 2B, is converted to the 2D image (the depth map) 42 in the direction viewing the vehicle from the side of the vehicle, the amount of information lost may be small. The depth map image 42 of FIG. 2B shows an example of a visualization by setting the brightness value of each pixel differently according to the depth value of each pixel.

The depth map generating unit 12 may generate the learning depth map for each learning design data and each learning mold data stored in the learning DB 11 and map the generated learning depth map to the corresponding learning design data or learning mold data to be stored to the learn DB 11.

The difference map generating unit 13 may use the learning depth maps of the learning design data and the learning mold data for each vehicle body panel stored in the learning DB 11 to generate a difference map (hereinafter, referred to as 'a learning difference map') for each vehicle body panel. That is, the difference map generating unit 13 calculates the difference value between the learning depth maps of the learning design data and the learning depth map of the learning mold data for each vehicle body panel for each pixel and maps the difference values calculated in this way for each pixel to create a learning difference map for each vehicle body panel. The difference map generating unit 13 may generate the learning difference map for each vehicle type, and classify the generated learning difference map for each vehicle body panel, that is, each vehicle type to be stored in the learning DB 11.

The data correcting unit 14 may correct the values (the difference values) of the pixels positioned in the edge area of the vehicle body panel in the learning difference map of each vehicle body panel stored in the learning DB 11 by using interpolation. In general, in a process of tuning the design data of the vehicle body panel and obtaining the mold data of the mass-production mold, a lot of correction occurs in the edge area of the vehicle body panel. Therefore, even in the learning difference map, the difference value between pixels positioned at the edge may appear large. The data correcting unit 14 may improve analysis robustness by interpolating and reducing the difference values between the pixels positioned in the edge region in each learning difference map with the difference values between the neighboring pixels. The data correcting unit 14 may correct the learning difference map and store the corrected learning difference map in the learning DB 11. The learning difference map generated in this way may be used as an actual value of a correction value when learning the prediction model to be described later.

The learning data generating unit 15 may generate the learning data to be used for the learning of the prediction model to be described later. In order to generate the prediction model in the deep learning method, it is essential to secure a large amount of learning data. However, it is extremely difficult to secure a large amount of the learning data due to the characteristics of the vehicle body panel. The learning data generating unit 15 may divide the learning depth maps and the learning difference map acquired for each vehicle body panel in a local patch based approach to solve this lack of the learning data. Through the division of the local patch based approach, each learning depth map and learning difference map may be divided into a plurality of patches (hereinafter, referred to as 'a learning patch').

The learning data generating unit 15 may normalize the learning patches to improve a learning speed. Then, the learning data generating unit 15 may generate the learning data from the normalized learning patches through data augmentation. The learning data generating unit 15 may perform the data augmentation through various transformations such as rotation, inversion, and mirroring of the learning patches.

As described above, the learning data generating unit 15 may increase the amount of data by dividing each learning depth map and each learning difference map into a plurality of learning patches and then increases the amount of data through the transformation of each learning patch, thereby obtaining sufficient learning data. The learning data generating unit 15 may store the generated learning data in the learning DB 11.

The learning unit 16 may generate the prediction model used for predicting the correction values for the mold design by learning an artificial neural network in the deep learning method by using the learning data stored in the learning DB 11. Here, the prediction model may be an artificial neural network that predicts the correction value for each pixel required to generate the mold data from the design data of the vehicle body panel.

The learning unit 16 may use an artificial neural network based on UNET to generate the prediction models. The learning unit 16 is used to predict the correction value, which is a real value not an image classification, through the prediction model, so it may be used by removing a classifier of an output layer, that is, a sigmoid function, which is a binary class discrimination function, from the UNET-based artificial neural network. Accordingly, the activation value of the output layer of the artificial neural network constituting the prediction model may be output as the output value (a correction value for each pixel) of the prediction model as it is.

The learning unit 16 may use a mean absolute error (MAE) as a loss function of the artificial neural network constituting the prediction model. In general, in the learning 2D depth map obtained from design data, the gradient according to the depth difference between the pixels corresponding to the edge of the vehicle body panel and the adjacent pixels appears large, and an outlier may be focused at the edge of the vehicle body panel. Accordingly, the learning unit 16 may reduce the effect of the correction value error of the pixels positioned at the edge on the learning by applying a weight value to the MAE, which is a loss function.

The learning unit 16 may calculate the gradient for each pixel for the learning 2D depth map of the learning design data to apply the weight value. The gradient of the pixel corresponds to the difference from the adjacent pixel and may be calculated using Equation 1 below.

$$G(x,y)=\sqrt{g_x(x,y)^2+g_y(x,y)^2}$$ [Equation 1]

In Equation 1 above, (x, y) represents 2D coordinates of the pixel for the gradient to be calculated in the learning 2D depth map, $g_x$(x, y) represents a gradient component (a horizontal gradient of an x-axis direction of the pixel, and $g_y$(x, y) represents a gradient component (a vertical gradient) of a y-axis direction of the pixel.

Figure 3:
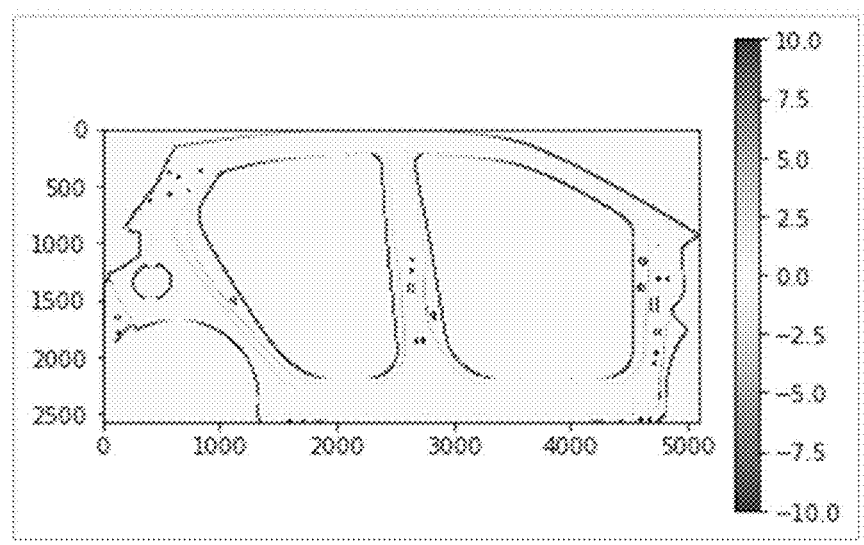
FIG. 3 is a view showing an example of visualizing a gradient for each pixel of a 2D depth map in a system for supporting a design of a vehicle body panel according to an exemplary embodiment.

FIG. 3 is a view showing an example of visualizing a gradient for each pixel in a 2D depth map. Referring to FIG. 3, it may be confirmed that the pixels with a large gradient (displayed in red or blue) are mainly located in the edge region of the vehicle body panel.

When the gradient of each pixel of the learning 2D depth map is calculated, the learning unit 16 may determine a weight value applied to the loss function calculation for each pixel according to the calculated gradient. That is, the learning unit 16 reduces the weight value applied when calculating the loss function for the pixel whose the gradient is larger than a predetermined value, so that even if there is an error in the correction value predicted for the pixel, the effect of the error may be reduced when the learning parameter is updated.

The loss function (MAE) to which the weight value is applied may be expressed by Equation 2 below.

$$MAE = \frac{1}{n}\sum_{i=0}^{n}\left|\left((w \times \hat{A})-(w \times A)\right)\right|$$ [Equation 2]

In Equation 2 above, w is the weight value, $\hat{A}$ is the prediction value of the correction value of each pixel, A is the actual value of the correction value of each pixel, and n is the number of pixels. That is, the loss function used in the learning unit 16 may be configured to calculate the average value of the absolute value of the values obtained by subtracting the value (w×A) obtained by applying the weight value to the actually measured value of the correction value of each pixel from the value (w×$\hat{A}$) obtained by applying the weight value to the prediction value of the correction value for each pixel). Here, the actually measured value of the correction value may be obtained from the learning difference map generated by the difference map generating unit 13.

The learning unit 16 may store the artificial neural network that is learned in the above-described manner, that is, the prediction model, to the learning DB 11. Also, when the design data and the mold data are acquired for a new vehicle type, the learning unit 16 may update the prediction model using them. The prediction model stored in the learning DB 11 may be used as a prediction model to predict the correction value for the design of the mass-production mold in the prediction system 20 to be described later.

Again, referring to FIG. 1, the prediction system 20 may predict the correction value data for the mold design from the design data (hereinafter, referred to as 'target design data') of the target vehicle body panel by using the prediction model generated from the learning system 10. The prediction system 20 may include a prediction DB 21, a depth map generating unit 22, a data division unit 23, a prediction unit 24, and a data synthesis unit 25.

The prediction DB 21 may store various data processed by the prediction system 20. The prediction DB 21 may store the design data of the vehicle body panel of the target vehicle type for which the mold is to be designed.

The depth map generating unit 22 may generate the depth map (hereinafter, referred to as 'a target depth map') of the target design data stored in the prediction DB 21. The depth map generating unit 22 may generate the target depth map that is the 2D image from the target design data that is the 3D image by using the same orthogonal view method as the depth map generating unit 12 of the learning system 10. The target depth map of the target design data generated by the depth map generating unit 22 may be stored in the prediction DB 21.

The data division unit 23 may divide the target depth map of the target design data into the same local patch based method as the learning data generating unit 15 of the learning system 10 to obtain a plurality of patches (hereinafter referred to as 'a target patch'). In the above-described learning system 10, when learning the prediction model, the learning depth map is divided into a plurality of learning patches and the learning is performed. Accordingly, the prediction system 20 may also divide the target depth map of the target design data into a plurality of target patches in order to predict the correction value using the prediction model. The data division unit 23 may store the plurality of target patches divided from the target depth map of the target design data in the prediction DB 21.

The prediction unit 24 may obtain the correction value for each pixel of each target patch from the prediction model by inputting the plurality of target patches to the prediction model generated by the learning DB 11. Here, the prediction model may be used to predict the correction value for each pixel for the mold design for each target patch, as described above. When the prediction of the correction value for each target patch is completed for each target patch, the prediction unit 24 may generate the correction value data of the target patch by mapping the predicted correction value for each pixel of the target patch. When the correction value data is obtained for each target patch through the prediction model, the prediction unit 24 may store the obtained correction value data in the prediction DB 21.

The data synthesis unit 25 may generate a final correction value data by synthesizing the correction value data obtained for each target patch into one correction value data. As described above, the correction value data of each target patch includes only the correction values for some pixels of the target design data. Accordingly, the data synthesis unit 25 may acquire one correction value data (the final correction value data) corresponding to the entire pixel of the target design data by synthesizing the correction value data obtained for each target patch. When the final correction value data is obtained, the data synthesis unit 25 may store it in the prediction DB 21.

The design supporting system 30 may support the mold design work of the worker by displaying the final correction value data obtained from the prediction system 20 on the screen. The design supporting system 30 may include a design supporting DB 31, a display 32, a similar panel searching unit 33, and a controller 34.

The design supporting DB 31 may store various data processed in the design supporting system 30. The design supporting DB 31 may store the design data, the mold data, and the actual correction value data of the vehicle body panels of the vehicle types that have previously completed the mass-production mold design. Here, the actual correction value data corresponds to the difference between the design data and the mold data of each vehicle body panel and represents the correction value data actually used in the process of obtaining the mold data from the design data.

The similar panel searching unit 33 may calculate a similarity score with the target vehicle body panel for each vehicle body panel of the vehicle types that has previously undergone the mass-production mold design through an image similarity search. The similar panel searching unit 33 compares the design data of each vehicle body panel of the existing vehicle type with the design data of the target vehicle body panel, or the mold data of each vehicle body panel of the existing vehicle type and the mold data of the target vehicle body panel, to obtain the similarity score.

The controller 34 may visualize the final correction value data predicted by the prediction system 20 to be displayed on the dashboard of the display 32.

Figure 4:
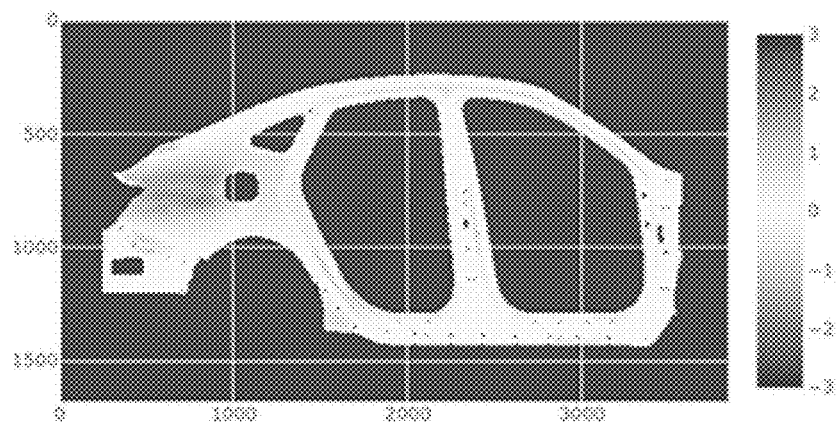
FIG. 4 is a view showing an example of visualizing and displaying a final correction value data of a target vehicle body panel in a system for supporting a design of a vehicle body panel according to an exemplary embodiment.

FIG. 4 is a view showing an example of visualizing and displaying final correction value data of a target vehicle body panel in a design supporting system 30. Referring to FIG. 4 as an example, the controller 34 may visualize the final correction value data by displaying the color of each pixel differently according to the corresponding correction value based on the depth map obtained from the design data of the target vehicle body panel.

Figure 5:
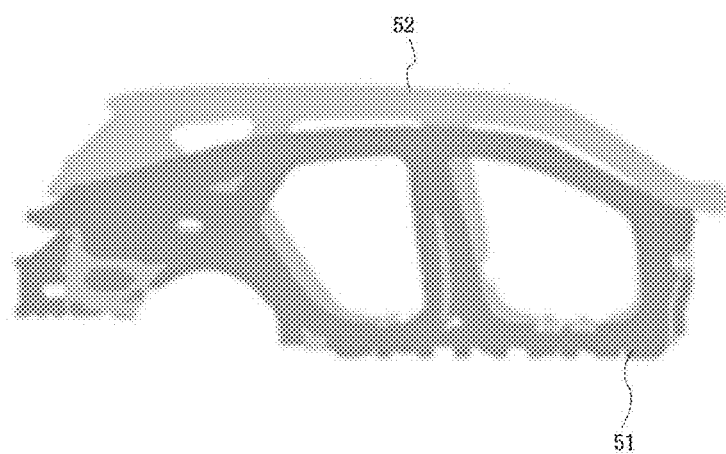
FIG. 5 is a view showing an example of overlapping and displaying design data of a vehicle body panel and a target vehicle body panel of a vehicle type selected as reference data in a depth map form in a system for supporting a design of a vehicle body panel according to an exemplary embodiment.

Based on the similarity score of each vehicle type calculated by the similar panel searching unit 33, the controller 34 may display a list of the vehicle types created in the order of the highest similarity score through the display 32. When any one vehicle type is selected by a worker from the list of the vehicle types, the controller 34 may overlap the design data of the vehicle body panel of the vehicle type selected from the list and the target vehicle body panel based on the depth map and display it on the dashboard of the display 32. FIG. 5 is a view showing an example of overlapping a design data of a vehicle body panel 52 and a target vehicle body panel 51 of a selected vehicle type in a form of a depth map. In addition, the controller 34 may visualize the actual correction value data of the vehicle body panel of the vehicle type selected from the list, similar to FIG. 4, based on the depth map of the design data and display it on the dashboard of the display 32.

As described above, the design supporting system 30 may overlap and display the design data of the similar vehicle body panel with the design data of the target vehicle body panel, and visualize and display the actual correction value data of the similar vehicle body panel, thereby supporting the worker to check the consistency of the correction value data predicted for the target vehicle body panel. In addition, when the worker corrects the design data of the target vehicle body panel and designs the mold data, the actual correction value data of the similar vehicle body panel may be referred to, thereby improving the convenience of the worker.

On the other hand, In FIG. 1, it is described that the learning system 10, the prediction system 20 and the design supporting system 30 each may include a separate DB (the learning DB 11, the prediction DB 21, and the design supporting DB 31) as an example, but the exemplary embodiment is not limited due to this. According to another exemplary embodiment, the learning system 10 and the prediction system 20, the learning system 10 and the design supporting system 30, the prediction system 20 and the design supporting system 30, or all systems (the learning system 10, the prediction system 20, the design supporting system 30) may share and use one DB.

The system for supporting the design of the vehicle body panel 1 as above-described may include at least one processor, and the functions of the depth map generating unit 12, the difference map generating unit 13, the data correcting unit 14, the learning data generating unit 15 and the learning unit 16 configuring the learning system 10, the depth map generating unit 22, the data division unit 23, the prediction unit 24 and the data synthesis unit 25 of the prediction system 20, and the similar panel searching unit 33 and the controller 34 of the design supporting system 30 may be performed by at least one processor. The processor may be composed of a microcontroller (MCU), a microprocessor (MPU), a central processing unit (CPU), an application specific integrated circuit (ASIC), or other chipsets.

Hereinafter, an operation method of a system for supporting a design of a vehicle body panel 1 according to an exemplary embodiment is described in detail with reference to FIG. 6 and FIG. 7.

Figure 6:
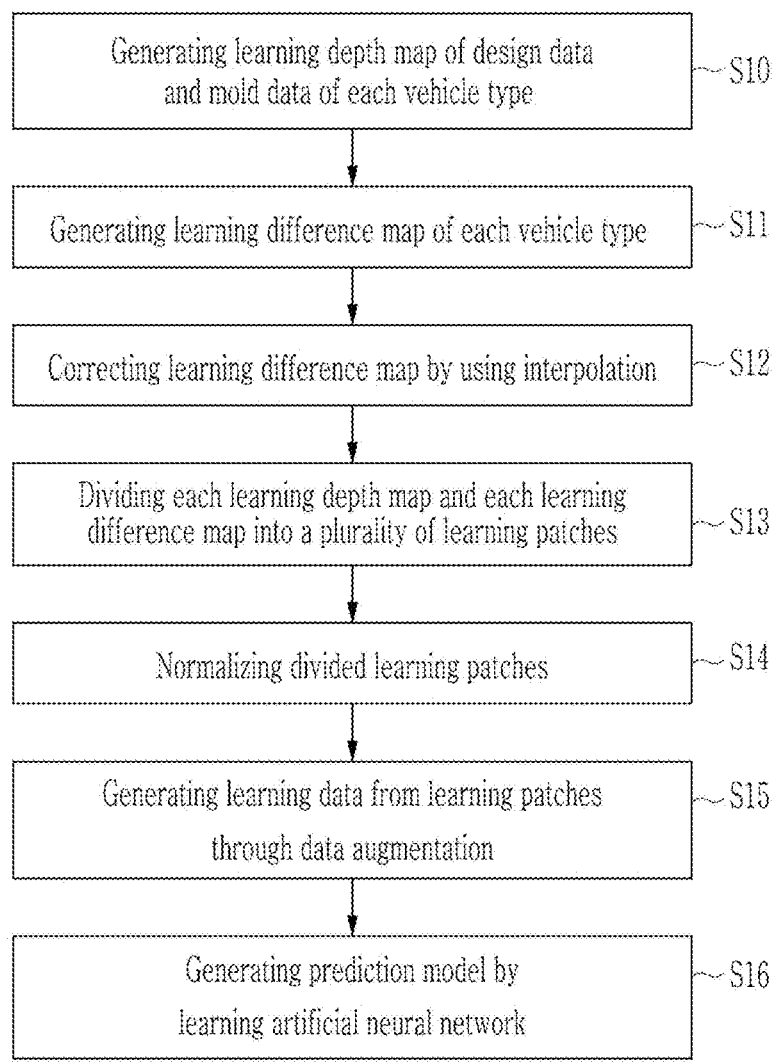
FIG. 6 is a view schematically showing a method for generating a correction value prediction model of a system for supporting design of a vehicle body panel according to an exemplary embodiment.

FIG. 6 is a view schematically showing a method for generating a correction value prediction model of a system 1 for supporting design of a vehicle body panel according to an exemplary embodiment. The prediction model generation method of FIG. 6 may be performed by the learning system 10 described above.

Referring to FIG. 6, the learning system 10 may generate a learning depth map of the design data and the mold data of the vehicle body panel for each of a plurality of vehicle types for which the mass-production mold design has already been completed (S10). In the step S10, the learning system 10 may generate the learning depth map, which is the 2D image, from the design data or the mold data, which is the 3D image, using an orthogonal view method, respectively. Here, the pixel value of each pixel of the learning depth map may include the depth value (the distance from the rendering plane) obtained for each pixel in an orthogonal view method.

When the learning depth maps are generated through the step (S10), the learning system 10 may generate the learning difference map corresponding to each vehicle type by using these (S11). In the step S11, the learning system 10 calculates the difference value between the learning depth map of the design data and the learning depth map of the mold data for each learning vehicle type for each pixel, and maps the calculated difference value for each pixel to generate the learning difference map.

The learning system 10 may correct the learning difference map of each vehicle type by using interpolation when the learning difference map for each vehicle type is generated through the step S11 (S12). That is, in the step S12, the learning system 10 may interpolate and correct the values (the difference values) of the pixels positioned in the edge region of the vehicle body panel in the learning difference map of each vehicle type.

When the correction of the learning difference map is completed through the step S12, the learning system 10 may divide each learning depth map and each learning difference map into a plurality of learning patches through the division of a local patch based method to increase the amount of the data used as the learning data (S13). In addition, the learning system 10 may normalize the partitioned learning patches to improve the learning speed (S14). Then, the learning system 10 may generate the learning data from the normalized learning patches through the data augmentation (S15). That is, the learning system 10 may acquire a large amount of learning data by performing the data augmentation through various methods of transformation such as the rotation, the inversion, and the mirroring of the learning patches.

After that, the learning system 10 may generate the prediction model used to predict the correction value for the mold design by learning the artificial neural network in a deep learning method using the augmented learning data (S16). The artificial neural network used to generate the prediction model in the step S16 is an artificial neural network based on a UNET and may have a structure in which a classifier (a sigmoid function) of the output layer is removed to enable a real-value prediction rather than image classification. In addition, the learning system 10 may use a mean absolute error (MAE) function as the loss function of the artificial neural network constituting the prediction model and adjust the weight value applied when calculating the loss function according to the gradient of each pixel for each pixel. That is, the learning system 10 may reduce the weight value applied when calculating the loss function for the pixels whose gradient is greater than or equal to a predetermined value. Here, the gradient of the pixel may be calculated from the learning depth map of the design data.

The prediction model generated in the above manner may be used to predict the correction value required to design the mold data from the design data of the vehicle body panel for which the design is confirmed thereafter.

Figure 7:
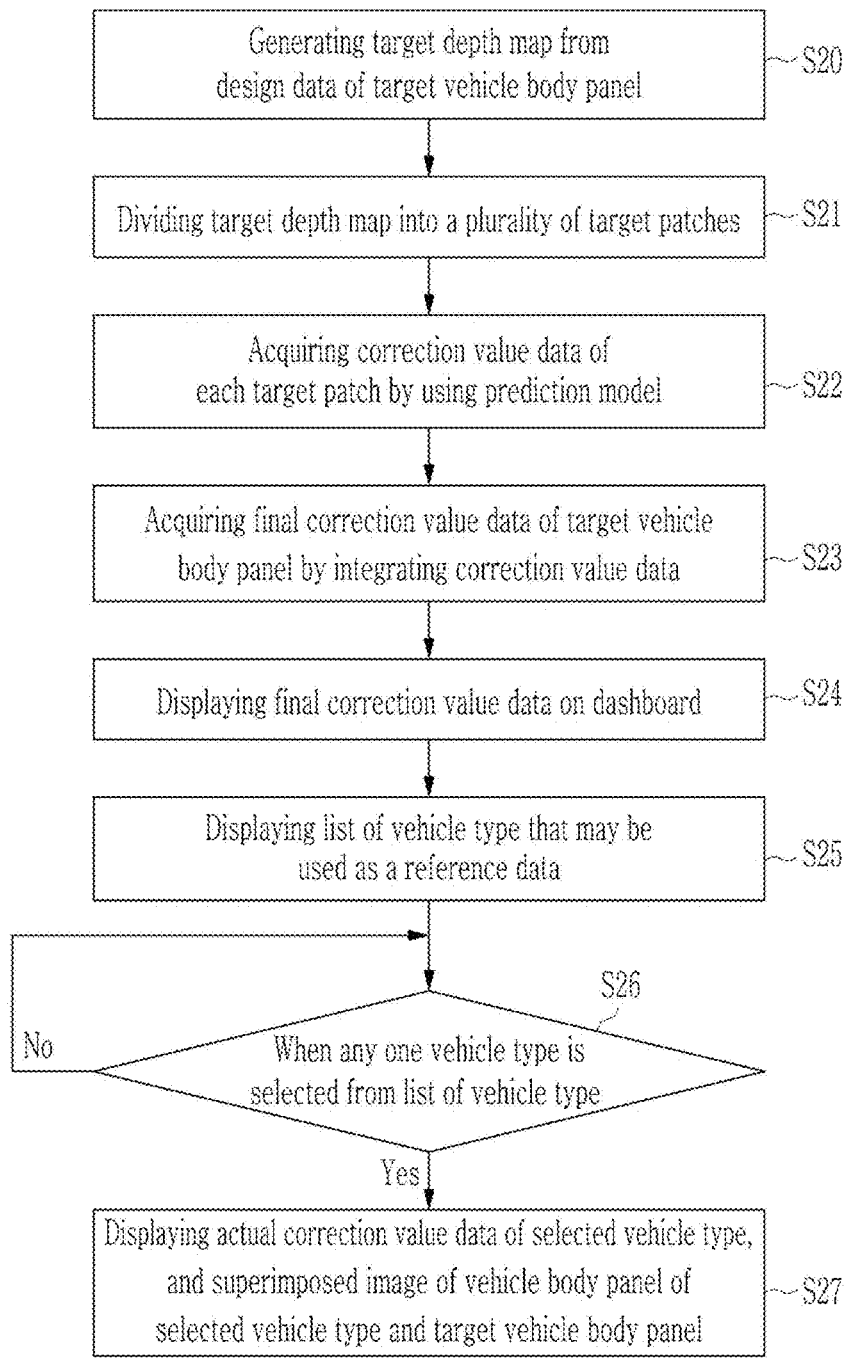
FIG. 7 is a view schematically showing a method for supporting a mold design using a predictive model in a system for supporting a design of a vehicle body panel according to an exemplary embodiment.

FIG. 7 is a view schematically showing a method for supporting a mold design using a predictive model in a system 1 for supporting a design of a vehicle body panel according to an exemplary embodiment. A method for supporting a mold design of FIG. 7 may be performed by the prediction system 20 and the design supporting system 30 described above.

Referring to FIG. 7, the prediction system 20 may generate the target depth map, which is the 2D image, from the design data of the target vehicle body panel when the design data, which is the 3D drawing image of the target vehicle body panel, is input after the design of the target vehicle body panel is confirmed (S20). In addition, the prediction system 20 may divide the target depth map generated through the step (S20) into a plurality of target patches by using the same local patch based method as the learning system 10 (S21).

When the depth map is divided into the plurality of target patches, the prediction system 20 may acquire the correction value data of each target patch by using the prediction model generated by the above-described learning system 10 (S22). Then, the prediction system 20 may acquire the final correction value data of the target vehicle body panel by integrating the correction value data obtained for each target patch (S23).

When the final correction value data of the target vehicle body panel is generated by the prediction system 20, the design supporting system 30 may visualize and display it on the dashboard (S24).

In addition, the design supporting system 30 may display the list of the vehicle types that may be used as reference data to support the design work of the worker (S25). In the step S25, the design supporting system 30 may calculate the similarity score with the target vehicle body panel for each vehicle body panel of the vehicle types that have already completed the mass-production mold design through an image similarity search. In addition, the design supporting system 30 may display the list of the vehicle types written in order of the highest similarity score on the screen based on the calculated similarity score of each vehicle type.

When any one vehicle type is selected from the list of the vehicle types displayed through the step S25 (S26), the design supporting system 30 may display the actual correction value data of the selected vehicle type, and the superimposed image of the vehicle body panel of the selected vehicle type and the target vehicle body panel (S27). In the step S27, the design supporting system 30 may display the selected vehicle type and the design data of the target vehicle body panel on the screen by overlapping each other based on the depth map. In addition, the design supporting system 30 may visualize and display the actual correction value data of the vehicle body panel of the selected vehicle type on the screen based on the depth map of the design data of the selected vehicle type.

As described above, the system for supporting the design of the vehicle body panel 1 may predict the correction value for the mold design by using the prediction model when the design of the vehicle body panel is confirmed, and visualize the predicted correction value on the dashboard to be displayed as the reference data, thereby the time required for the mold design may be reduced. In addition, it may effectively support the mold design work for workers with poor design capabilities, thereby reducing the number of revision processes in the mold design process and shortening the overall production schedule.

The operation method of the system for supporting the design of the vehicle body panel 1 according to an exemplary embodiment described above may be executed through software. When being implemented through software, the components of the present disclosure are code segments that perform necessary tasks. The program or code segments may be stored on a processor readable medium or transmitted by a computer data signal coupled with a carrier wave in a transmission medium or communication network.

The computer-readable recording medium may include all kinds of recording devices in which data that can be read by the computer system is stored. Examples of the computer-readable recording medium include a ROM, a RAM, a CD-ROM, a DVD ROM, a DVD RAM, a magnetic tape, a floppy disk, a hard disk, and an optical data storage device. In addition, the computer-readable recording medium is distributed to the computer devices connected to the network so that the computer-readable code can be stored and executed by a distributed method.

The drawings and the detailed description described above are examples for the present disclosure and are provided to explain the present disclosure, and the scope of the present disclosure described in the claims is not limited thereto. Therefore, those having ordinary skill in the art will appreciate that various modifications or changes and other equivalent embodiments are possible from the embodiments. In addition, some of the components described in the specification may be omitted without deterioration of the performance or added in order to improve the performance by those skilled in the art. Moreover, the sequence of the steps of the method described in the specification may be changed depending on a process environment or equipment by those skilled in the art. Accordingly, the scope of the present disclosure should be determined not by the above-mentioned embodiments but by the appended claims and equivalents thereto.

What is claimed is:

1. A method for supporting a mold design for a vehicle body panel, comprising:
   generating a target depth map (a depth map), which is a 2D image, from target design data of a target vehicle body panel, which is a 3D image;
   generating a prediction model of an artificial neural network structure;
   obtaining a correction value data for a mold design for designing mold data from the target design data by inputting the target depth map to the prediction model of the artificial neural network structure; and visualizing and/or displaying correction value data for the mold design;
wherein the generating of the prediction model comprises:
respectively converting and generating a learning depth map as a 2D image from learning design data and learning mold data as a 3D image for each of a plurality of vehicle types;
generating a difference map between the learning depth map of the learning design data and the learning depth map of the learning mold data for each of the plurality of vehicle types;
dividing the learning depth map and the difference map corresponding to each of the learning design data and the learning mold data into a plurality of learning patches, respectively;
normalizing the plurality of learning patches;
generating a plurality of learning data from a plurality of normalized learning patches through data augmentation; and
learning the artificial neural network to generate the prediction model by using the plurality of learning data.

2. The method for supporting the mold design of claim 1, wherein the generating comprises generating the target depth map from the target design data by using an orthographic view manner.

3. The method for supporting the mold design of claim 1, further comprising learning the artificial neural network in a deep learning manner.

4. The method for supporting the mold design of claim 1, further comprising correcting the values of pixels positioned in the edge region of the vehicle body panel in the difference map through interpolation, and
wherein the dividing into the plurality of learning patches comprises dividing the difference map corrected by interpolation into the plurality of learning patches.

5. The method for supporting the mold design of claim 1, wherein the artificial neural network is a structure in which a classifier of an output layer is removed from a UNET-based artificial neural network.

6. The method for supporting the mold design of claim 1, wherein
for a loss function of the artificial neural network, a weight value is applied according to a gradient per pixel of the learning depth map of the learning design data, and
the weight value decreases when the gradient of the corresponding pixel is greater than or equal to a predetermined value.

7. The method for supporting the mold design of claim 1, further comprising:
dividing the target depth map into a plurality of target patches, and
wherein the obtaining of the correction value data for the mold design comprises:
inputting the plurality of target patches to the prediction model to obtain a plurality of correction value data corresponding to the plurality of target patches from the prediction model; and
integrating the plurality of correction value data to obtain correction value data for the mold design.

8. The method for supporting the mold design of claim 1, further comprising:
displaying a list of at least one vehicle type that may be used as reference data during the mold design through an image similarity search; and
visualizing and displaying actual correction value data between the design data and the mold data of the vehicle body panel of a vehicle type selected from the list if any one vehicle type is selected from the list.

9. The method for supporting the mold design of claim 8, further comprising
overlapping and displaying the design data of the vehicle body panel of the selected vehicle type and the target design data based on the depth map.

10. A system for supporting a mold design of a vehicle body panel, comprising:
a learning system including at least one processor and configured to generate a prediction model that predicts correction value data for a mold design for designing mold data from target design data of a target vehicle body panel by learning an artificial neural network in a deep learning method;
a prediction system including at least one processor and configured to generate a target depth map that is a 2D image from the target design data that is a 3D image, and obtain correction value data for the mold design by inputting the target depth map to the prediction model; and
a design supporting system including at least one rand configured to visualize and display correction value data for the mold design;
wherein the learning system is further configured to perform functions of:
a depth map generating unit respectively generating a learning depth map as a 2D image from the learning design data and the learning mold data as a 3D image for each of a plurality of vehicle types;
a difference map generating unit for generating, for each of the plurality of vehicle types, a difference map bet reen the learning depth map of the learning design data and the learning depth map of the learning mold data;
a learning data generating unit respectively dividing the learning depth map, and the difference map corresponding to the learning design data and the learning mold data into a plurality of learning patches, normalizing the plurality of learning patches, and generating a plurality of learning data from the plurality of learning patches through data augmentation, and
a learning unit generating the prediction model by using the plurality of learning data to learn the artificial neural network system.

11. The system of claim 10, wherein the prediction system is further configured to generate the target depth map from the target design data by using an orthogonal view method.

12. The system of claim 10, wherein,
the learning system is further configured to perform functions of a data correcting unit that corrects the values of the pixels positioned in the edge region of the vehicle body panel in the difference map through interpolation, and
the learning data generating unit divides the difference map corrected by interpolation into the plurality of learning patches.

13. The system of claim 10, wherein the artificial neural network is a structure in which a classifier of an output layer has been removed from a UNET-based artificial neural network.

14. The system of claim 10, wherein
for the loss function of the artificial neural network, a weight value is applied according to the gradient per pixel of the learning depth map of the learning design data, and the weight value decreases when the gradient of the corresponding pixel is greater than or equal to a predetermined value.

15. The system of claim 10, wherein
the prediction system is further configured to perform functions of:
a data division unit that divides the target depth map into a plurality of target patches;
a prediction unit that inputs the plurality of target patches to the prediction model to obtain a plurality of correction value data from the prediction model; and
a data synthesis unit for merging the plurality of correction value data to obtain correction value data for the mold design.

16. The system of claim 10, wherein the design supporting system is further configured to:
display a list of at least one vehicle type that may be used as reference data during a mold design through an image similarity search; and
visualize and display the actual correction value data between the design data and the mold data of the vehicle body panel of a vehicle type selected from the list if any one vehicle type is selected from the list.

17. The system of claim 16, wherein the design supporting system is further configured to overlap and display the design data of the vehicle body panel of the selected vehicle type and the target design data based on the depth map.

* * * * *